United States Patent [19]

Ariga et al.

[11] 4,356,864
[45] Nov. 2, 1982

[54] RADIATING DEVICE FOR POWER AMPLIFIER ETC.

[75] Inventors: Shoji Ariga; Kazuo Suzuki, both of Toda, Japan

[73] Assignee: Clarion Co., Ltd., Tokyo, Japan

[21] Appl. No.: 200,208

[22] Filed: Oct. 24, 1980

[51] Int. Cl.³ ............................................. H01L 23/36
[52] U.S. Cl. .................................. 165/80 B; 165/128; 165/185; 361/383; 361/386
[58] Field of Search .................. 165/185, 80 B, 80 D, 165/128, 129; 357/81, 82; 361/383, 384, 386; D14/96; D8/350, 353

[56] References Cited

U.S. PATENT DOCUMENTS

| | | | |
|---|---|---|---|
| D. 223,368 | 4/1972 | Horak | D14/96 |
| D. 252,810 | 9/1979 | Bocko | D14/96 |
| 2,838,740 | 6/1958 | Larky et al. | 165/185 X |
| 2,984,457 | 5/1961 | Wulc | 165/185 |
| 3,091,736 | 5/1963 | Germain | 165/185 X |
| 3,187,082 | 6/1965 | Allison | 165/80 B |
| 3,192,306 | 6/1965 | Skonnord | 361/384 |
| 4,222,090 | 9/1980 | Jaffe | 361/386 |

FOREIGN PATENT DOCUMENTS 482350  3/1917  France ................................. 165/185

OTHER PUBLICATIONS

Andros et al., Heat Sink with Internal Holes, IBM Technical Disclosure Bulletin, vol. 23, No. 9, Feb. 1981, pp. 4097-4098.

*Primary Examiner*—Sheldon Richter
*Attorney, Agent, or Firm*—Wallenstein, Wagner, Hattis, Strampel & Aubel

[57] ABSTRACT

A radiating device for a power amplifier etc. comprising a plurality of fin members fitted to an escutcheon body so as to project therefrom and openings formed on the escutcheon body at positions around the base portions of the fin members, respectively.

5 Claims, 4 Drawing Figures

RADIATING DEVICE FOR POWER AMPLIFIER ETC.

BACKGROUND OF THE INVENTION

1. Field of the Invention

This invention relates to a radiating device for a power amplifier etc. with an escutcheon which is employable as a member of a component stereo etc.

2. Description of the Prior Art

It is the most essential requirement for electrical appliances having large heat emission, e.g. a power amplifier etc. to assure good heat dissipation to always develop their best performances. On the other hand, for instance, where the power amplifier is used as a component unit of a component stereo or the like, there is another aesthetic requirement for the appearance of the power amplifier and a further requirement for the size of the power amplifier.

In a conventional power amplifier for use in a component stereo etc., an escutcheon portion thereof is usually made of a metallic material such as aluminum and molded therefrom by die casting and has considerably bulky radiating fins for effecting necessary heat dissipation. Thus, in the conventional power amplifier, the appearance and the size is sacrificed for the performance thereof.

OBJECTS OF THE INVENTION

It is therefore an object of the present invention to provide a radiating device for a power amplifier etc. having an escutcheon, which is capable of obviating the disadvantages involved in the conventional radiating device.

SUMMARY OF THE INVENTION

In accordance with the present invention, there is provided a radiating device comprising:
- an escutcheon of an electrical appliance, and a plurality of fin members fitted to said escutcheon for heat dissipation;
- said escutcheon having a plurality of openings each formed at a position adjacent to the base portion of the respective fin member.

DESCRIPTION OF THE EMBODIMENTS

Figure 1:
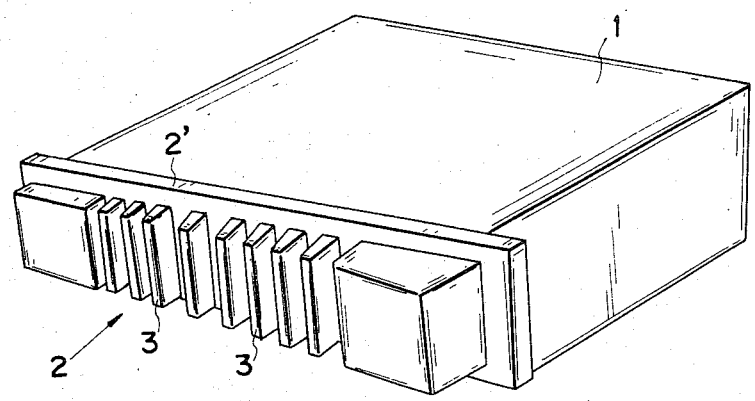
FIG. 1 is a perspective view of a radiating device for a power amplifier in accordance with the present invention, illustrated in a state fitted to a casing of the amplifier.

Referring now to the drawing, there are illustrated preferred embodiments of the present invention applicable to power amplifiers.

In FIG. 1, numeral 1 designates a casing of a power amplifier and an escutcheon 2 is fitted at a front of the casing.

Figure 2:
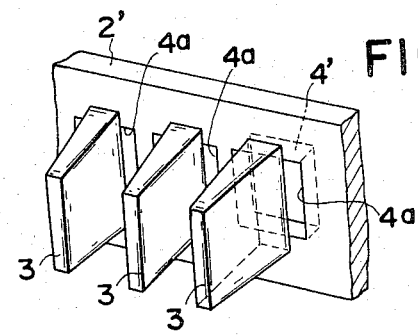
FIG. 2 is a perspective, enlarged view of a part of the radiating device illustrated in FIG. 1.

The escutcheon 2 is comprised, in the embodiment of FIG. 2, of an escutcheon body 2', a plurality of fin members 3 which are provided in such a manner that they project from the escutcheon body 2' and juxtaposed in a row across the escutcheon body 2' and openings 4a for heat conviction formed in the escutcheon body 2' at positions where the fin members are fitted to the escutcheon body, respectively.

Each of the openings 4a is, for example, in the form of an elongated slot. The elongated slots may be formed for example by the following method:

Square openings 4' are first formed on the escutcheon body 2' which are disposed in a row across the escutcheon body 2'. The fin members 3 are fitted to the escutcheon body 2' in such a manner that they vertically stride the square openings, respectively, walling up most of the respective openings.

The escutcheon body 2' and the fin member 3 may be formed for example of a plastic material.

Figure 3:
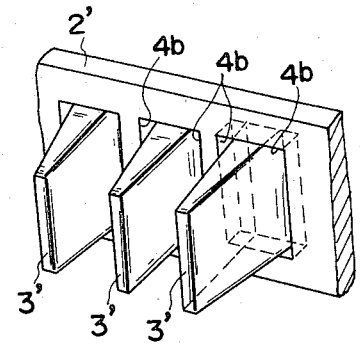
FIG. 3 is a similar perspective, enlarged view of a part of another form of radiating device in accordance with the present invention.
Figure 4:
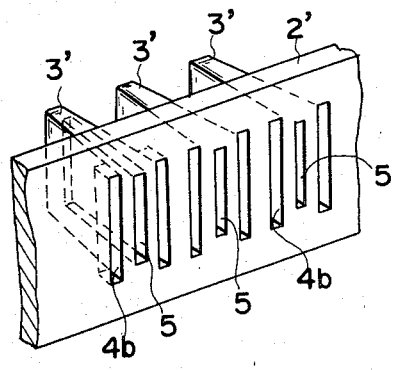
FIG. 4 is a perspective view of the rear side of the device illustrated in FIG. 3.

FIG. 3 illustrates another embodiment of the present invention. In this embodiment, each of the fin members 3' is fitted, at its base end portion, in the square opening 4 as described above. The rear end of the fin member 3' is in alignment with the rear face of the escutcheon body 2'.

Each fin member 3' has a hollowed portion 5 which communicates with the respective opening and the interior of the casing 1 of the amplifier. This hollowed portion 5 increases a heat transfering area of the fin member 3'.

The hollowed portion may be provided in the fin member 3 of FIG. 2.

In the radiating device of the power amplifier etc. having an escutcheon in accordance with the present invention, heat is dissipated through the openings 4a or 4b by heat convection when the power amplifier is operated.

Since the heat transfering area of the fin member 3' is increased by the provision of the hollowed portion 5, the radiating effect is further enhanced by the heat dissipation through the fin member 3'.

More specifically, heat dissipation of the radiating device of the present invention is achieved effectively by combination of and through interaction between the opening 4a or 4b and the hollowed portion 5.

The escutcheon 2, in general, has an important aesthetic effect on the appearance of the power amplifier in which the escutcheon is used or the component stereo in which the power amplifier is incorporated.

In this respect, although the openings 4a or 4b for heat conviction are formed on the escutcheon 2 in the present invention, they are hidden or screened by the fin members 3 or 3' provided at the openings 4a or 4b, respectively, so that the appearance of the escutcheon 2 is by no means spoiled by the openings. On the contrary, the plural fin members and elongated slots formed along the respective fin members provide, in combination, a desired aesthetic effect on the appearance of the power amplifier.

As described above, according to the present invention, a plurality of fin members are juxtaposed in a row on the escutcheon body and the elongated slots are formed adjacently to and along the base portions of the fin members, respectively, so that heat is effectively dissipated through the slots to assure best performance of the power amplifier.

Where the fin members are formed hollow, the heat transfering areas of the fin members are increased so that the heat-dissipation characteristics can be further improved. In other words, the size of the escutcheon and accordingly the size of the casing of the electrical appliance to which the escutcheon is employed can be reduced.

Further according to the present invention, since the heat dissipation is much enhanced due to the provision of the openings as described above, plastic materials may be employed as a material of the fin members. Therefore, the configuration, shape, finishings of the fin members and the openings can be selected more freely as compared with the fin members made of a metallic material. Thus, the aethetic effect can be further enhanced, and the weight of the escutcheon can be reduced.

We claim:

1. A radiating device comprising: an escutcheon of an electrical appliance, and a plurality of fin members fitted to said escutcheon for heat dissipation; said escutcheon having a plurality of openings each formed at a position adjacent to the base portion of the respective fin member, each of said openings being formed square, and each of said fin members being fitted to the escutcheon in such a manner that it is fitted in the associated opening.

2. A radiating device according to claim 1, wherein each of said fin members is formed hollow so that the fin as well as the adjacent opening receives heat to be dissipated from within the housing.

3. A radiating device comprising: an escutcheon of an electrical appliance, and a plurality of fin members fitted to said escutcheon for heat dissipation; said escutcheon having a plurality of openings each formed at a position adjacent to the base portion of the respective fin member, each of said fin members having a hollowed portion which communicates with the associated opening so that the fin as well as the adjacent opening receives heat to be dissipated from within the housing.

4. A radiating device according to claim 3, wherein each of said fin members is fitted to the escutcheon in such a manner that it walls up the major part of the respective opening.

5. A radiating device according to claim 1 or 3, wherein said escutcheon and fin members are made of a plastic material.

* * * * *